United States Patent [19]

Forsyth

[11] Patent Number: 4,692,934

[45] Date of Patent: Sep. 8, 1987

[54] X-RAY LITHOGRAPHY SYSTEM

[75] Inventor: James M. Forsyth, Pittsford, N.Y.

[73] Assignee: Hampshire Instruments, Rochester, N.Y.

[21] Appl. No.: 669,442

[22] Filed: Nov. 8, 1984

[51] Int. Cl.$^4$ .............................................. G21K 5/10
[52] U.S. Cl. ...................................... 378/34; 378/210
[58] Field of Search ........................................... 378/34

[56] References Cited

U.S. PATENT DOCUMENTS

| | | | |
|---|---|---|---|
| 3,562,793 | 8/1967 | McCann et al. | 313/44 |
| 4,121,128 | 10/1978 | Roberts | 313/7 |
| 4,184,078 | 1/1980 | Nagel et al. | 378/34 |
| 4,304,627 | 12/1981 | Lewis | 376/148 |

FOREIGN PATENT DOCUMENTS

| | | | |
|---|---|---|---|
| 0058137 | 8/1982 | European Pat. Off. | 378/34 |
| 0191433 | 11/1983 | Japan | 378/34 |
| WO79/00340 | 6/1979 | PCT Int'l Appl. | |

OTHER PUBLICATIONS

Nagel et al., "Repetitively Pulsed-plasma Soft X-ray Source", *Applied Optics*, vol. 23, No. 9, 5-1984.

Primary Examiner—Craig E. Church
Assistant Examiner—David P. Porta
Attorney, Agent, or Firm—Harry W. Barron

[57] ABSTRACT

Disclosed herein is a X-ray lithography system in which X-rays are generated by a laser beam focused upon a target within an evacuated chamber to create a soft X-ray emitting plasma which also emits debris particles. A thin sheet of X-ray transparent gas is provided between the target and a mask used in the lithographic process to displace the particles away from the mask. The sheet of gas may also be used to maintain a pressure differential across an opening in the evacuated chamber through which the X-rays pass towards the target. In addition, the gas sheet may be used to cool the X-ray mask by placing the mask close to the sheet but at a sufficient distance so that the sheet does not interfere with the mask.

15 Claims, 5 Drawing Figures

X-RAY LITHOGRAPHY SYSTEM

This invention relates to X-ray lithography machines and more particularly to an X-ray lithography machine in which soft X-rays are generated from a plasma created by focusing a high powered laser beam on a suitable target.

Conventional integrated circuit chips are fabricated by a technique known as photolithography. In a photolithography system, ultraviolet light of a certain wavelength is applied through a mask to a semiconductor wafer coated with a compound known as photoresist. The mask serves to block the light from reaching certain portions of the photoresist while allowing the light to reach other portions. The portion in which the light is applied to the photoresist results in the photoresist becoming exposed. By known techniques, either the exposed or the unexposed photoresist can be moved, leaving a pattern on the semiconductor wafer after removal of the exposed photoresist. Thereafter, the exposed semiconductor material can be implanted with doping materials to form P or N regions, or oxide or metal layers may be applied in known manners. The technique of applying the light through the mask to the semiconductor wafer occurs generally for each major step in the process of fabricating the semiconductor device. Reference is made to U.S. Pat. No. 4,444,492 to Martin E. Lee entitled "Apparatus for Projecting a Series of Images onto Dies of a Semiconductor Wafer" for additional information on photolithography.

It is a well known limitation of photolithography that the resolution and size of the lines which can be fabricated on the semiconductor wafer are limited by the wavelength of the light used. Present modern photolithography techniques generally limit the width of a line to approximately one micron due to the wavelength of the light used in the photolithography process. However, as chips become more dense, it is desirable that the width of the lines on a chip be smaller than the practical limit of one micron achievable with photolithography techniques.

One suggested manner of reducing the width of the lines is to use X-rays rather than light as the exposing radiation. X-rays, as is well known, have a smaller wavelength than light. For instance it has been suggested in U.S. Pat. No. 3,743,842 to Henry I. Smith et al. to utilize soft X-rays (wavelength 2 to 20 angstroms) which are applied through an X-ray mask to expose an X-ray resist material on a semiconductor device. The soft X-rays are generated by impinging an electron beam on a target. However it has been found that the X-ray generating means proposed in the Smith et al. U.S. Pat. No. 3,743,842 provides insufficient X-rays and thus require 10 or more minutes to expose the X-ray resist. In such circumstances, it is difficult to use the device described by Smith to expose the X-ray resist material in a production environment where the exposure time should be measured in tenths of seconds or less.

One technique which has been suggested to overcome the above noted problems with respect to X-ray tubes is described in U.S. Pat. No. 4,184,078 to Nagel et al. In this patent, there is described a X-ray lithography system in which a soft X-ray emitting plasma is created by, for instance, focusing a high powered laser pulse on a target material, such as aluminum, thereby creating a plasma at the point the laser strikes the target. The plasma, in turn, emits soft X-rays in a narrow band dependent upon the target material. If sufficient power from the laser pluse were present, sufficient X-rays could be generated to allow exposure in an extremely short time (e.g. nanoseconds).

As described in the Nagel et al. patent, in order to create the necessary plasma to generate X-rays, the target must be placed within an evacuated chamber. For example, the pressure within the chamber holding the target should be less than 0.01 Torr. As described in the Nagel et al. patent, the mask and X-ray resist coated semiconductor wafer are placed within the evacuated chamber so that the X-rays can expose them. The reason for this is that conventional vacuum chambers are constructed of a material which will absorb the X-rays. Hence the chamber itself will block the X-rays from reaching a mask and X-ray resist coated wafer placed outside of the chamber, unless an X-ray transparent window is placed in the chamber as suggested in U.S. Pat. No. 3,743,842 to Smith.

Another problem inherent in the design described in the Nagel et al. patent is that when the plasma is created by focusing the laser beam on the target a certain amount of debris is created. Nagel et al. recognizes this problem and attempts to block the debris by using moving Mylar sheets over the mask. However, as the debris is scattered throughout the chamber, it still eventually settles on the mask and leads to defects in the subsequent exposure due to the shadows cast by debris particles through the transparent openings in the mask.

Another problem common with the prior art techniques, as suggested in the Smith et al. patent or the Nagel et al. patent, is that the X-rays applied to the mask, particularly those X-rays absorbed by the areas of the mask designed to block the passage of X-rays, cause the mask temperature to increase. As the temperature of the mask increases, the mask tends to deform and may cause a misalignment or other distortion between the mask and previous exposed patterns fabricated on the semiconductor wafer. It would be more desirable to have the mask maintained at a constant temperature so that the pattern of the X-rays hitting the X-ray resist coated wafer is more controllable.

In accordance with one aspect of this invention, there is provided a combination of a source of X-rays within an evacuated chamber, an object towards which the X-rays are directed, and means for providing an X-ray transparent narrow gas stream between the source and the object.

One preferred embodiment of the present invention is hereafter described with reference being made to the following figures, in which.

Figure 4:
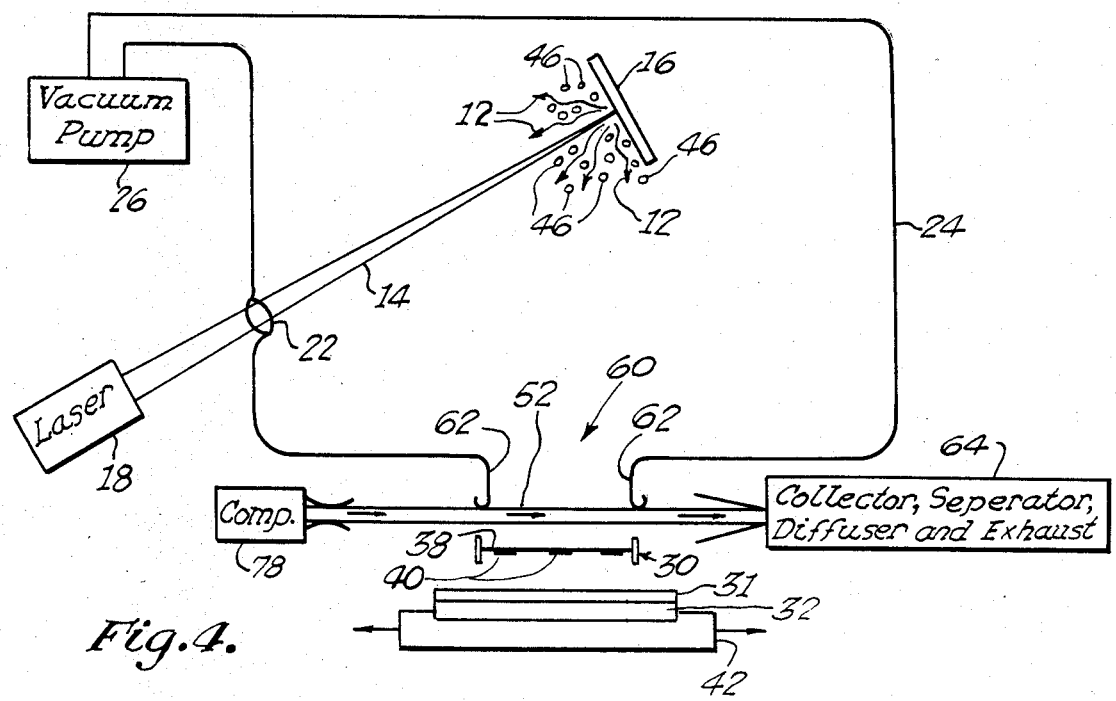
Figure 5:
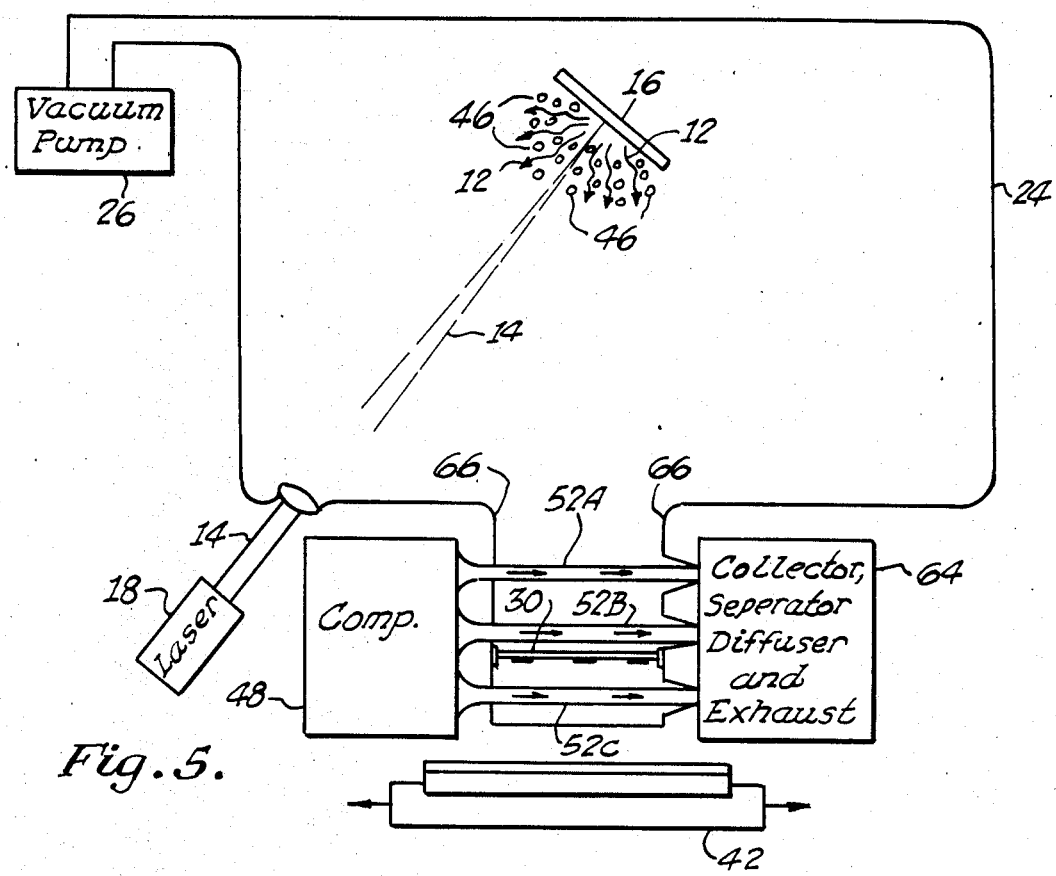

FIG. 4 shows an alternate embodiment of the present invention in which the stream of gas is utilized to displace the debris particles formed when creating the X-rays and in addition, is used to maintain the vacuum within the chamber through an opening for the X-rays to pass; and FIG. 5 shows another alternate embodiment in which the three streams of gas function for the purpose of displacing the debris and maintaining the vacuum through an opening in the vacuum chamber and in addition are used to cool the mask.

Figure 1:
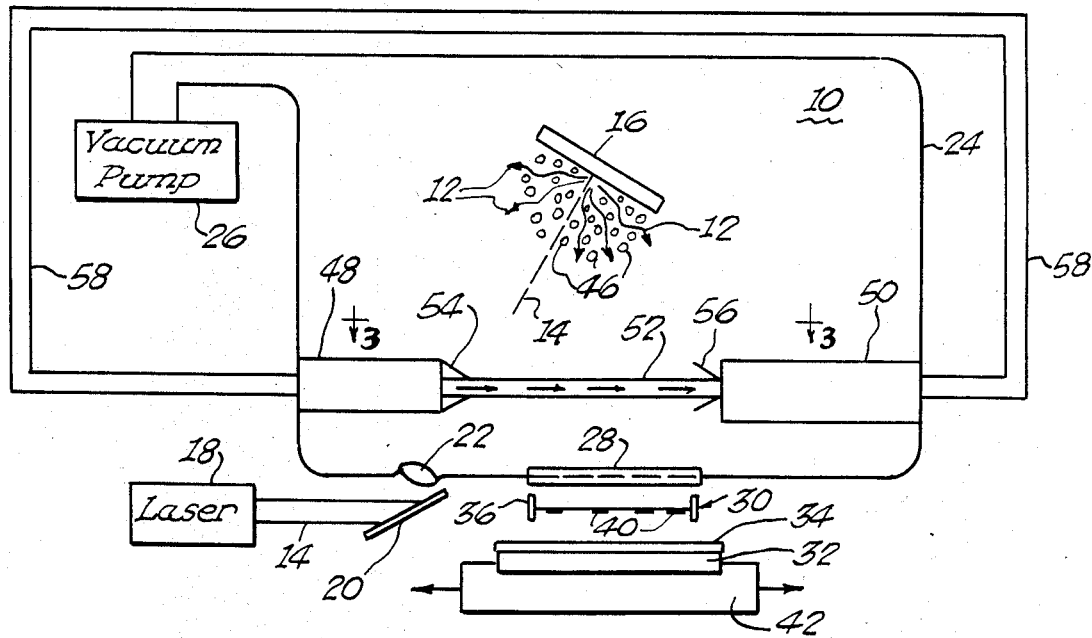
FIG. 1 shows an X-ray lithography system incorporating a sheet of gas to displace the debris particles from reaching the mask.

Referring now to FIG. 1, X-ray lithography system 10 is shown schematically. X-rays 12 are generated by a laser beam 14 being focused upon a target 16. Target 16 may be any material from which an X-ray generating plasma is generated when laser beam 14 strikes target 16. For instance, target 16 may be a metal, such as iron which causes X-rays of 8-15 angstroms to be generated. Laser beam 14 is generated by a laser generator 18 applying a high powered laser pulse towards mirror 20. For example, each laser pluse provided by laser 18 may contain 10 joules of energy and the pulse duration may be in the 1-10 nsec range. Mirror 20 directs the laser beam 14 through a lens 22 which focuses the beam 14 at a particular spot on target 16. Lens 22 should focus beam 14 to a diameter of approximately 40-80 microns at the surface of target 16. In order for a plasma to be created when laser beam 14 is focused on target 16, it is necessary that target 16 be within evacuated chamber 24. Chamber 24 is maintained at a low pressure relative to the outside thereof by vacuum pump 26. For example the pressure within chamber 24 may be less than 0.1 Torr.

At least some of the X-rays 12 generated from target 16 pass through an X-ray transparent windows 28 fabricated into the bottom of chamber 24. Window 28 may be any material transparent to X-rays, such as heavy gauge beryllium foil which must be of sufficient strength to withstand the pressure differential on both sides thereof. Lens 22 may also be fabricated into the wall of chamber 24, thereby allowing laser 18 and mirror 20 to be remote from the inside of chamber 24.

The X-rays passing through window 28 are directed towards an object such as a mask 30 and semiconductor wafer 32. Mask 30 is a known device which will selectively pass X-rays to form a pattern on a semiconductor device 32. Device 32 is coated with a layer of X-ray resist material 34 which becomes exposed by the X-rays. Mask 30 includes a frame 36 having an X-ray transparent membrane 38 within the frame 36. Affixed to membrane 38 is a pattern of X-ray absorbing material 40, such as gold, which blocks the X-rays from being applied to expose X-ray resist material 34. The exposed X-ray resist material 34 may be further processed in a known manner to form a semi-conductor integrated circuit.

Mask 30 is held in a fixed position and semiconductor device 32 is moved between various positions so that each individual area thereof may be exposed by X-rays passing through mask 30. Wafer 32 is held by a wafer handling device 42 which is controlled to cause the wafer to move between the various areas desired for exposure. An example of such a wafer handling device is described in more detail in U.S. Pat. No. 4,444,492 in the name of Lee.

Figure 2:
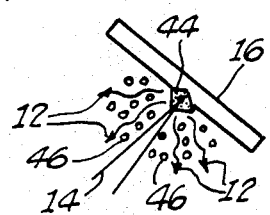
FIG. 2 shows the manner in which the plasma and debris are formed.

Referring now to FIG. 2, when laser beam 14 strikes target 16, a certain portion of target 16 is burnt away as the temperature is raised to over one million degrees centigrade. This, in turn, causes an area of plasma 44 to be formed and X-rays 12 are emitted from the plasma. In addition to the X-rays 12, minute particles of debris 46 are emitted as the plasma cools. These particles 46 fall upon window 28 and act as X-ray absorbing matter to partially block the passage of X-rays through window 28 towards mask 30. If mask 30 were placed within chamber 24, such as is shown in the Nagel et al. prior art patent, the particles of debris 46 would fall directly on mask 30, thereby causing damage due to the heat of the particles as well as blocking the pattern of X-rays provided by mask 30.

Figure 3:
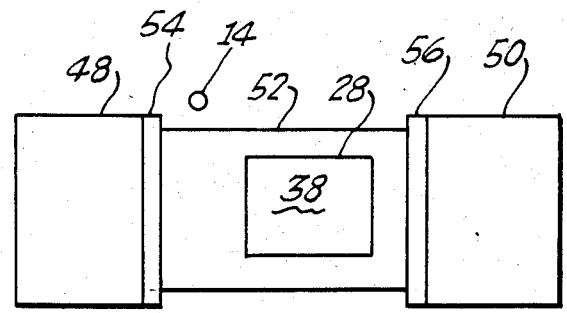
FIG. 3 shows a view of the gas sheet from lines 3—3 in FIG. 1.

Referring again to FIG. 1 and to FIG. 3, a compressor 48 and a collector/separator unit 50 are provided to cause a sheet of gas 52 to be provided across the window 28. The sheet of gas 52 is formed by a nozzle 54, which may be a part of compressor 48, and a opening 56, which may be a part of collector/separator 50, accepts the gas and directs it into collector/separator 50. As seen from FIG. 3, the sheet of gas is at least as wide as the window 28 through which is seen the membrane 38 of mask 30.

It is well known in the art that by providing a jet sheet of gas across an opening in an evacuated chamber, the pressure differential between the inside and outside of the chamber can be maintained. For instance, this is extensively used in the generation of laser beams from an evacuated chamber. An example of such a sheet of gas used to maintain the partial vacuum required for a gas laser is shown in U.S. Pat. No. 3,973,218 to Kepler et al. and the patents cited therein.

As the particles of debirs 46 fall from target 16 towards window 28, they are swept away by gas sheet 52. Collector separator 50 separates the particles from the gas and provides the gas through a return path 58 back to the input of compressor 48. It is important that the type of gas selected to be formed into gas sheet 52 be a substantially X-ray transparent gas. Low molecular weight gases, such as air, hydrogen, helium and nitrogen are sufficiently X-ray transparent so that X-rays are not absorbed into the gas, but rather are provided through window 28 to mask 30. The thickness of gas sheet 52 should be chosen to stop the most energetic debris particles. All of the gas should be collected into collector/separator 50 in order to prevent loss of partial vacuum within chamber 24.

The design of the nozzle assembly 54 will produce a laminar flow condition in gas stream 52. This flow stream would tend to carry debris particles throughout the gas handling system or out of the exhaust, if so fitted. To separate the debris from the gas jet, a collector/separator 50 is used which consists of a diffuser to break up the gas flow lines into a turbulent structure, causing the debris to fall into a collector located below the diffuser.

Referring now to FIG. 4, an alternate embodiment of the present invention is shown. For convenience, like reference numbers are given to like components where the function performed by the component is identical. Certain components are positioned differently in FIG. 4 than they were in FIG. 1. Mirror 20 is eliminated in FIG. 4 and laser beam 14 is provided directly through lens 22 from laser source 18. Lens 22 is also positioned, for exemplary purposes, on the side of chamber 24 rather than on the bottom. Further, closed window 28 is changed to an open window 60 defined by a lip 62 extending from the bottom of chamber 24.

As shown in FIG. 4, the sheet 52 of gas provided from compressor 48 is provided across lips 62 of open window 60. The sheet of gas 52 serves the function of maintaining the vacuum within chamber 24 created by pump 26. At the same time the sheet of gas 52 blows away any debris particles 46 that fall from target 16 through open window 60 as taught by the embodiment shown in FIGS. 1-3. Thus, the sheet of gas 52 serves the dual function of maintaining the vacuum within chamber 24 and dispersing the debris particles 46.

By placing mask 30 sufficiently close to sheet 52, the heat generated within mask 30 by the absorption therein of X-rays 12 can be dissipated. Care must be taken, however, so that mask 30 is not so close to gas sheet 52 that the turbulence effects created at the outer boundary of gas sheet 52 do not physically effect mask 30 or the alignment of mask 30 with respect to device 32. Thus, sheet 52, performs three separate functions in the embodiment shown in FIG. 4, that is, it allows an opening in chamber 24 while isolating the vacuum in chamber 24, it blows away debris particles 46 and it cools mask 30.

In FIG. 4, the collector/separator 50 shown in FIG. 1 is replaced by a collector separator diffuser and exhaust system 64. This type of a system is used if the gas is not fed back from the collector/separator to the compressor 48, but rather it is exhausted into the surrounding area. Such a device is well known in the art and is not described in detail herein. However, one may use either the collector/separator 50 shown in FIG. 1 or the collector/separator diffuser exhaust system 64 shown in FIG. 4. It would be preferable to use the collector/separator 50, with a feed back path 58 to compressor 40, where a gas other than air is used.

Referring now to FIG. 5, a third embodiment of the subject invention is shown. Again, like numerals are used for like elements. The principle difference between the embodiment shown in FIG. 5 and that shown in FIGS. 1 or 4 is that the window 28 or opening 60 is replaced by a neck 66 at the bottom of chamber 24. It is a well known fact that while a single sheet of gas, such as 52 shown in FIG. 4, can maintain a pressure differential on both sides of chamber 24, a plurality of gas sheets can maintain a much greater pressure differential. Thus, in the FIG. 5 embodiment, compressor 48 provides three separate gas sheets 52A, 52B and 52C within the neck 66. The nozzles 54 and funnels 56 may be formed within the neck 66 or may be a part of the compressor 48 and collector, separator, diffuser and exhaust assembly 64.

Another difference between the embodiments in FIGS. 1 and 4 and FIG. 5 is that mask 30 is placed within the neck 66 between two of the sheets of gas 52A, 52B or 52C. Specifically, mask 30 is placed between sheets 52B and 52C. Positioned in this manner both sheets 52B and 52C can be used to cool mask 30. Again care must be taken to avoid any turbulence effect on mask 30 by the gas sheets 52B or 52C. Thus the gas sheets 52A, 52B and 52C in FIG. 5 perform the same three functions as the gas sheet 52 shown in FIG. 4, that is they disperse the debris 46 formed from target 16, they maintain the vacuum within chamber 24 so that an opening may be used which does not absorb X-rays and they cool mask 30 so that it may be maintained at a constant temperature.

The same cooling effect provided by the two gas sheets 52B and 52C could also be achieved by providing a second gas sheet 52 in the FIG. 4 embodiment between mask 30 and semiconductor device 35. This may be preferrable for certain materials used in mask 30 where insufficient heat escapes due to the partial vacuum between gas sheets 52B and 52C in FIG. 5.

What is claimed is:

1. An X-ray lithography system comprising: a laser beam source for generating a laser beam;
   a target of a given material upon which said laser beam is focused, said laser beam being of sufficient intensity to create a plasma from said given material, there being soft X-rays and debris emitted from said plasma along a given path;
   an X-ray mask positioned to pass a pattern of X-rays to an object; and
   means to generate sheet of an X-ray transparent gas across said path between said mask and said target to displace said debris away from said mask, said sheet having a thickness selected to displace the most energetic debris emitted from said plasma.

2. The invention according to claim 1 wherein said means to generate said sheet of gas includes a compressor and a sheet forming nozzle.

3. The invention according to claim 1 wherein said means to generate said sheet of gas further includes means to separate said debris from said gas.

4. The invention according to claim 3 wherein said means to separate includes means to diffuse said gas and means for providing said gas as an exhaust.

5. The invention according to claim 3 wherein said means to separate includes means to provide said gas to said means to generate said sheet.

6. The invention according to claim 5 wherein said gas is a low molecular weight gas.

7. The invention according to claim 6 wherein said gas is air.

8. The invention according to claim 6 wherein said gas is helium.

9. The invention according to claim 6 wherein said gas is nitrogen.

10. The invention according to claim 6 wherein said gas is hydrogen.

11. An X-ray lithography system comprising:
    an evacuated chamber;
    a laser beam source for generating a laser beam;
    a target positioned within said chamber, said laser beam being focused to intersect said target and being of sufficient intensity to create a plasma from said target, there being soft X-rays and debris emitted from said plasma along a defined path;
    an X-ray mask positioned in said path to pass a pattern of X-rays to an object; and
    means to generate entirely within said chamber a sheet of an X-ray transparent gas across said path to inhibit the movement of said debris towards said mask, said sheet having a thickness sufficient to inhibit the most energetic of said debris.

12. The invention according to claim 11 wherein said sheet of gas is remote from said target, whereby the intersection of said laser beam and said target remains in an evacuated area of said chamber.

13. The invention according to claim 12 wherein said means to generate said sheet of gas includes a compressor and a sheet forming nozzle.

14. The invention according to claim 13 wherein said means to generate said sheet of gas includes means to separate the debris from said gas.

15. The invention according to claim 14 wherein said means to separate includes means to diffuse said sheet of gas and to provide said diffused and separated gas to said compressor.

* * * * *